(12) United States Patent
Chow et al.

(10) Patent No.: US 7,005,325 B2
(45) Date of Patent: Feb. 28, 2006

(54) SEMICONDUCTOR PACKAGE WITH PASSIVE DEVICE INTEGRATION

(75) Inventors: Seng Guan Chow, Singapore (SG); Il Kwon Shim, Singapore (SG); Ming Ying, Singapore (SG); Byung Hoon Ahn, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/773,716

(22) Filed: Feb. 5, 2004

(65) Prior Publication Data

US 2005/0173783 A1 Aug. 11, 2005

(51) Int. Cl.
*H01L 21/44* (2006.01)
*H01L 21/48* (2006.01)
*H01L 21/50* (2006.01)

(52) U.S. Cl. .................. 438/123; 438/124; 257/724; 257/676

(58) Field of Classification Search ............... 438/123, 438/124; 257/666, 779, 676
See application file for complete search history.

(56) References Cited

U.S. PATENT DOCUMENTS

| 5,648,682 | A  | * | 7/1997  | Nakazawa et al. ......... 257/673 |
| 5,714,405 | A  | * | 2/1998  | Tsubosaki et al. ......... 438/118 |
| 5,804,880 | A  | * | 9/1998  | Mathew .................... 257/779 |
| 6,486,535 | B1 |   | 11/2002 | Liu |
| 6,696,952 | B1 | * | 2/2004  | Zirbes .................... 340/572.1 |
| 2002/0195693 | A1 |  | 12/2002 | Liu et al. |

* cited by examiner

*Primary Examiner*—Nitin Parekh
(74) *Attorney, Agent, or Firm*—Mikio Ishimaru

(57) ABSTRACT

A system is provided for an integrated circuit package including a leadframe having a lead finger. A groove is formed in a lead finger for a conductive bonding agent and a passive device is placed in the groove to be held by the conductive bonding agent.

10 Claims, 16 Drawing Sheets

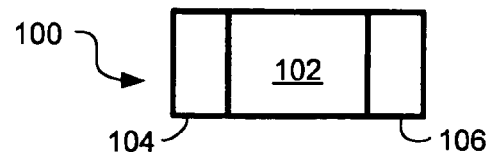
FIG. 1
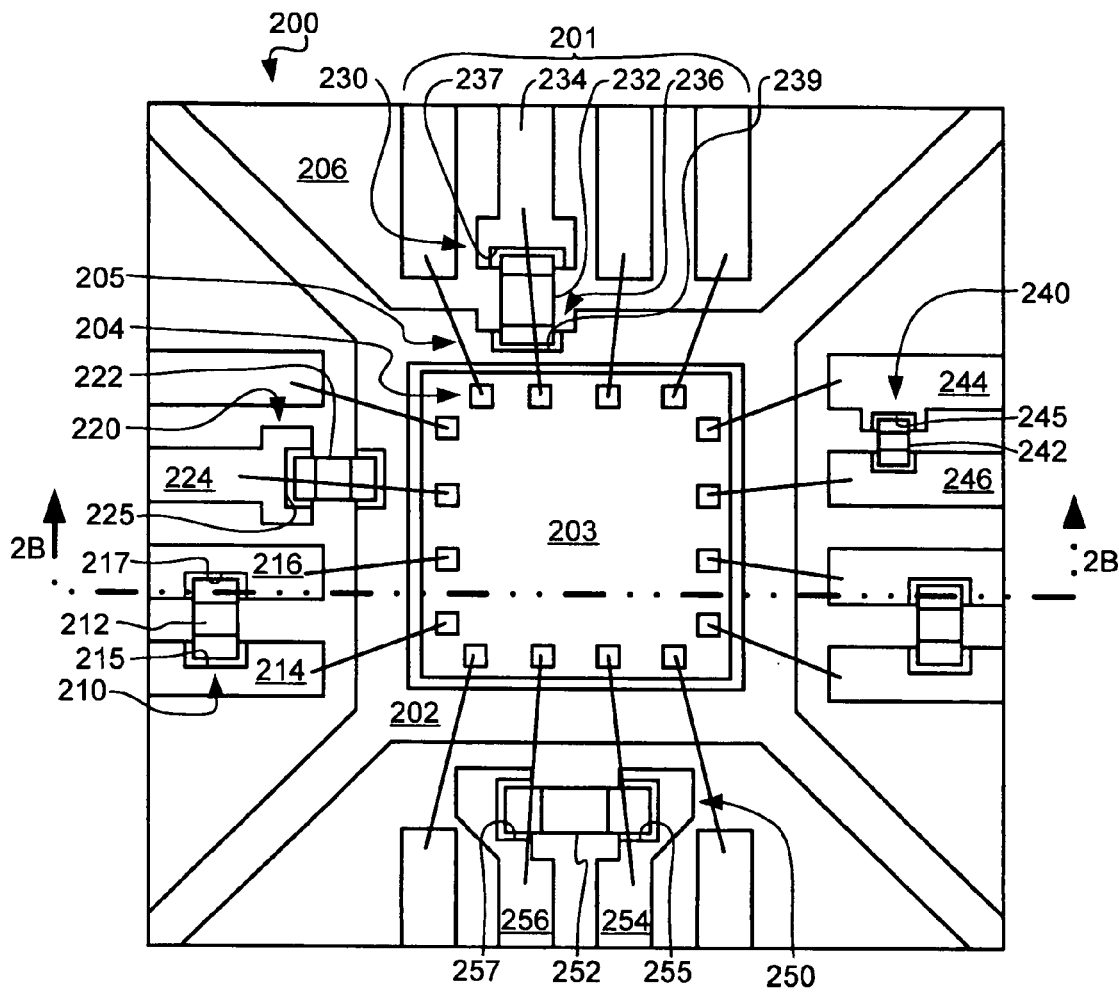
FIG. 2A
FIG. 2B
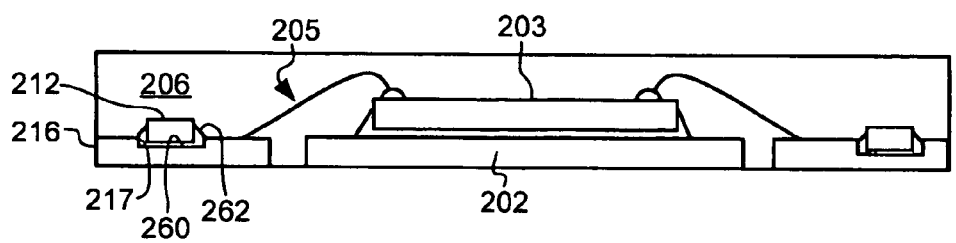

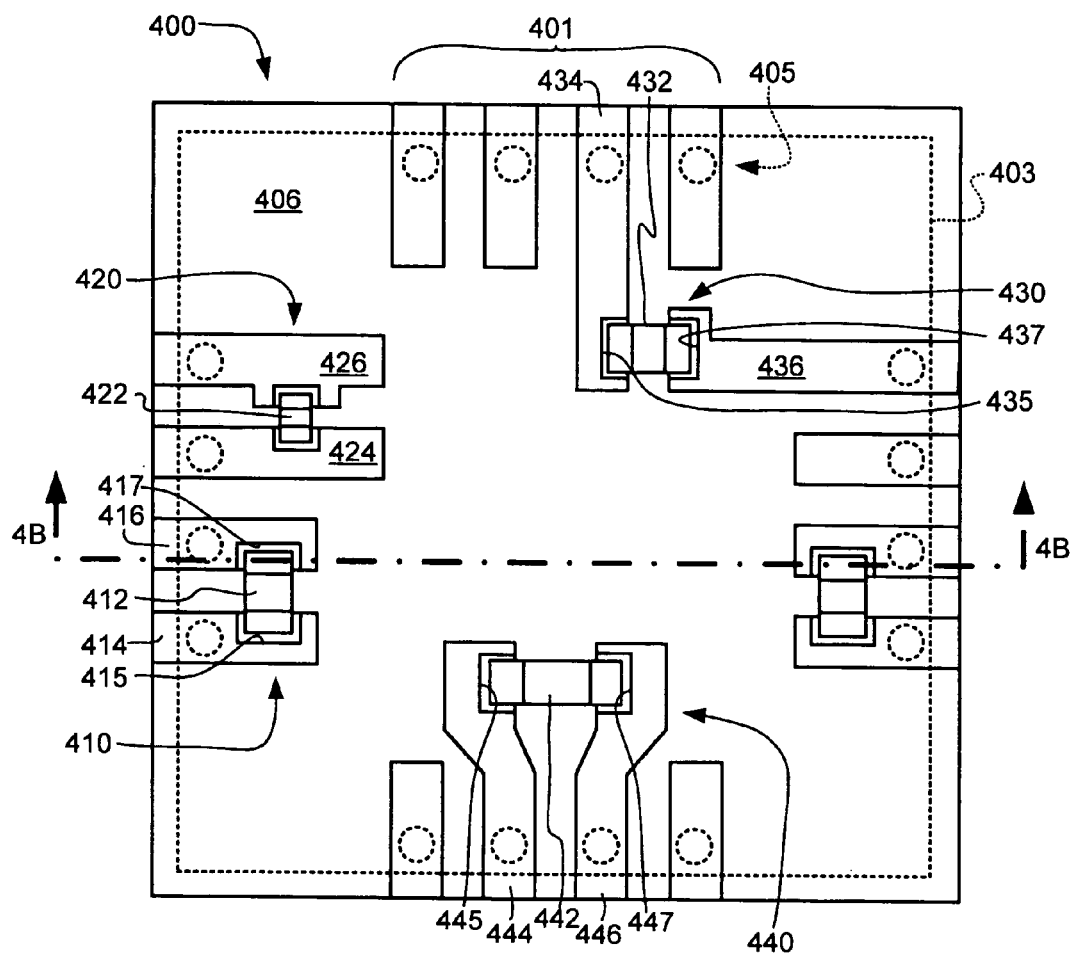
FIG. 4A
FIG. 4B
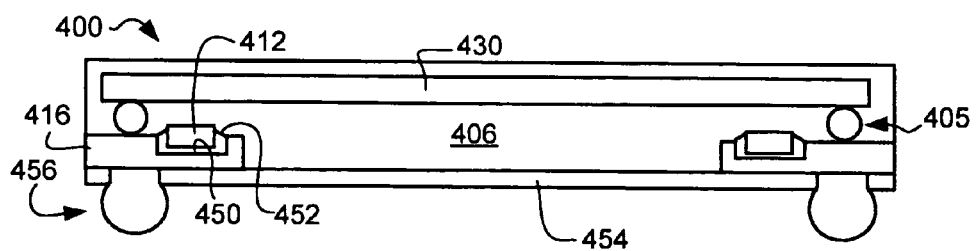

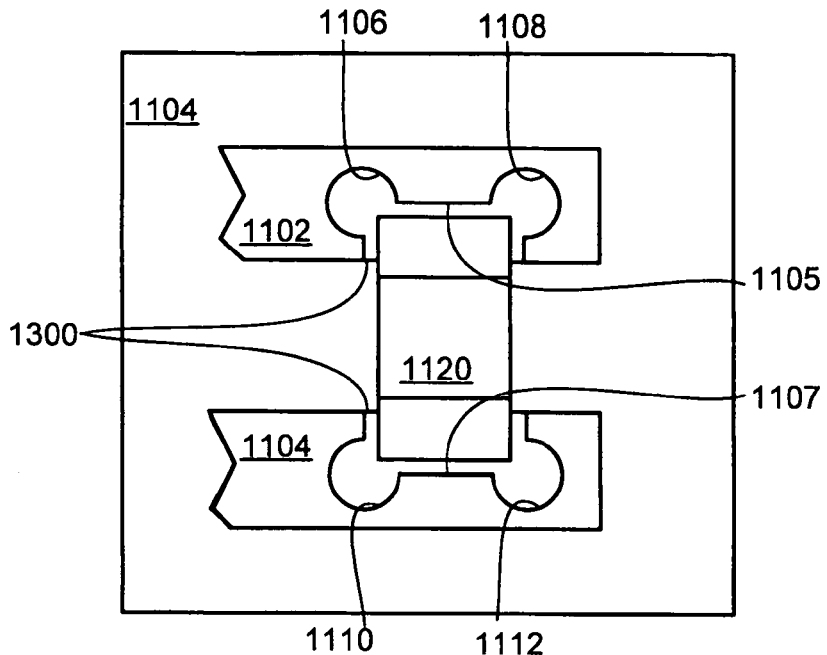

FIG. 13

```
                    1400
                      ↓
    ┌─────────────────────────────────────┐
    │ PROVIDING A LEADFRAME HAVING A LEAD │
    │              FINGER                  │
    │               1402                   │
    └─────────────────────────────────────┘
                      │
    ┌─────────────────────────────────────┐
    │   FORMING A GROOVE IN A LEAD FINGER  │
    │               1404                   │
    └─────────────────────────────────────┘
                      │
    ┌─────────────────────────────────────┐
    │  PLACING A CONDUCTIVE BONDING AGENT IN│
    │              THE GROOVE              │
    │               1406                   │
    └─────────────────────────────────────┘
                      │
    ┌─────────────────────────────────────┐
    │  PLACING AN ELECTRONIC DEVICE IN THE │
    │  GROOVE TO BE HELD BY THE CONDUCTIVE │
    │            BONDING AGENT             │
    │               1408                   │
    └─────────────────────────────────────┘
```

SEMICONDUCTOR PACKAGE WITH PASSIVE DEVICE INTEGRATION

BACKGROUND

1. Technical Field

The present invention relates generally to the fabrication of semiconductor integrated circuit packages, and more specifically to packages with leadframes for passive devices.

2. Background Art

Digital products, such as cell phones and wrist watches have become aspects of everyday life. The core of these digital electronic products are integrated circuit die which continue to be made smaller and more reliable while increasing performance and speed.

An integrated circuit is typically packaged in a tiny box-type structure usually on the order of a few millimeters per side. The integrated circuit package generally has cylindrical terminals formed through a passivation layer of the integrated circuit die to square or rectangular contacts near its edges for directly bonding the integrated circuit die to a foil-type leadframe that is usually less than 0.5 mm in thickness. The integrated circuit packages are generally wire bonded or ball bonded to the foil-type leadframe. A body of a hardened, insulative encapsulant material then covers the integrated circuit die and the leadframe.

A series of problems related to the integrated circuit package and the leadframe becomes worse as the size of both decrease. Negative electrical effects such as electromagnetic interference, or undesirable coupling between leads in the leadframe, result in slowdown of electrical signals, cross-talk, or other problems.

To overcome these problems, passive components have been placed on the leadframe between the leads to eliminate negative electrical effects. These passive devices include capacitors, resistors, and inductors.

With the pressing demand on integrated circuit die to have higher density, higher integrity, compact size, and multiple functions, passive devices have also become smaller and lighter. As a result, they can be integrated into an integrated circuit package using surface mount technology (SMT). However, this has created its own set of problems with many different types of defects.

Keeping in mind that a passive device may be the size of a grain of sand, problems such as misalignment, bridging, drawbridging/tombstoning, or missing passive devices may occur. In bridging, the solder used to attach the passive devices may bridge or short-circuit adjacent passive devices. Misalignment means that the passive devices may only touch the solder connections so as to provide high resistance, or may actually not contact the solder connections required so as to produce an open circuit. Drawbridging/tombstoning occurs when the surface tension of solder lifts the passive device off the leadframe and results in an open circuit. A missing passive device can occur because the devices are extremely small and may be easily dislodged.

Prior developments have not taught or suggested any solutions, and, thus, solutions to these problems have long eluded those skilled in the art.

SUMMARY OF THE INVENTION

The present invention provides a system for an integrated circuit package including a leadframe having a lead finger. A groove is formed in a lead finger for a conductive bonding agent and a passive device is placed in the groove to be held by the conductive bonding agent.

This system eliminates problems that occur during fabrication, such as misalignment, bridging, drawbridging/tombstoning, and/or missing passive devices.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1 is a view of a passive device with a body and conductor metal ends;

FIG. 2A is a plan view of an integrated circuit package in accordance with the present invention;

FIG. 2B is a cross-sectional view of the structure of FIG. 2A taken along line 2B—2B;

FIG. 4A is a plan view of an integrated circuit package in accordance a further embodiment of the present invention;

FIG. 4B is a cross-sectional view of the structure of FIG. 4A taken along line 4B—4B;

FIG. 13 is a close-up plan view of the passive device of FIG. 11B after solder reflow; and FIG. 14 is a flow chart of a method for forming an integrated circuit package in accordance with the present invention.

DETAILED DESCRIPTION OF THE INVENTION

Figure 3A:
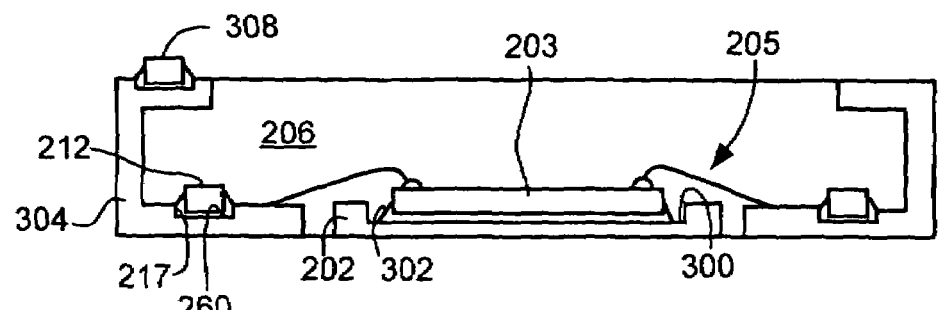
FIG. 3A is a cross-sectional view of an integrated circuit package similar to FIG. 2B of an alternative embodiment of the present invention.

Referring now to FIG. 1, therein is shown a passive device 100 having a body 102 and conductor metal ends 104 and 106.

In the following description, numerous specific details are given to provide a thorough understanding of the invention. However, it will apparent that the invention may be practiced without these specific details. In order to avoid obscuring the present invention, some well-known system configurations and process steps are not disclosed in detail.

The term "horizontal" as used herein is defined as a plane parallel to the conventional plane or surface of the integrated circuit package, regardless of its orientation. The term "vertical" refers to a direction perpendicular to the horizontal as just defined. Terms, such as "on", "above", "below", "bottom", "top", "over", and "under", are defined with respect to the horizontal plane.

Likewise, the drawings showing embodiments of the invention are semi-diagrammatic and not to scale and, particularly, some of the dimensions are for the clarity of presentation and are shown greatly exaggerated in the FIGS. In addition, where multiple embodiments are disclosed and described having some features in common, for clarity and ease of illustration and description thereof like features, one to another, will ordinarily be described with like reference numerals. For example, where structures perform the same function, they will be described with like reference numerals although their shapes and configurations may be different.

As will be apparent from the above, using a leadframe with grooves as a chip carrier for integration of active die and passive devices, especially for low input/output pin count devices, is an economically viable option in comparison to placing the devices on a separate substrate. Passive devices can be pre-attached to the grooves with proper opening sizes and locations using surface mount technology (SMT) and/or adhesive dispensing methods. The present invention allows integration of passive devices with body sizes longer or shorter than the lead pitch or lead width by alterations only in the leads themselves.

Further, since the passive devices can be attached into the grooves securely by a conductive bonding agent, the present invention overcomes or mitigates the disadvantages with surface mounting on the leads or the substrate. The groove structure in the leadframe also serves as a means to reduce the package thickness when incorporating passive devices.

Conventional sheet metal forming methods such as stamping, coining, drilling, etching, etc. can also be readily employed to form the required groove structures in the leadframes.

For wire-bonded type leadless packages, passive devices may be laid out on the leads surrounding the paddle without interfering with the wire-bonding process.

For ball-bonded leads, passive devices can be set into grooves below the ball bonds. No underfill material is required for molded ball-bonded leads on lead packages. The passive device can be connected to any two leads below the ball bonds rather than the adjacent leads only. For ball bonds, an additional paddle serves as a ground/thermal plane below the die. Additional solder balls can be attached to further improve the electrical and thermal performance of the ball bonding. In one of the preferred embodiments, a stepped paddle profile, or relief, helps improve moldability below the ball bonds and prevents void formation.

The number of passive devices on a printed circuit board can also be reduced when the passive devices can be built into the integrated circuit package. Consequently, the printed circuit board size can be reduced or more room will be provided for external traces routing on the board.

Wrap-around leaded packages can be formed for higher integration. Package stacking applications can be made or additional passive devices can be mounted on top of the external leads.

To prevent solder bridging, solder paste reservoirs can be provided alongside the groove. This allows the paste to be printed (or adhesive to be dispensed) inside the reservoir before or after the passive device is temporarily attached to the groove. The gap between the passive device and the groove can be filled with solder with capillary effect during a regular solder reflow operation.

Further, passive devices and high-temperature solder bumps can be reflowed concurrently.

Referring now to FIG. 2A, therein is shown a plan view of an integrated circuit package 200 in accordance with the present invention. The integrated circuit package 200 has a number of lead fingers 201 around the periphery thereof. The lead fingers 201 have generally straight tips but may have tips of different configurations, which are used in accordance with the present invention.

The integrated circuit package 200 further includes a leadframe paddle 202, which can be of various configurations, upon which an integrated circuit die 203 is attached. The integrated circuit die 203 has a number of contact pads 204 to which a number of wires 205 are attached at one end and connected to the lead fingers 201 at the other end. The lead fingers 201, the leadframe paddle 202, the integrated circuit die 203, and the wires 205 are embedded in an encapsulant 206. The lead fingers 201, the leadframe paddle 202, and the wires 205 are generally made of conductive materials and the encapsulant 206 is of an insulating material.

In FIG. 2A, grooves are formed in the lead fingers 201 and/or the leadframe paddle 202.

A medium device configuration 210 is shown with a medium passive device 212 extending between lead fingers 214 and 216 having straight tips and lead finger grooves 215 and 217 in the sides, respectively.

The terms "small", "medium", and "large" for size are relative to each device configuration or size of device. Generally, a small device and a large device have widths or lengths between the conductor metal ends which are respectively smaller or larger than the distance between the main bodies of the structures it must span, such as the distance between lead fingers or lead fingers and the leadframe paddle. A medium device will have widths or lengths between the conductor metal ends that are in between those of small and large devices.

A medium device configuration 220 has a medium passive device 222 extending between a lead finger 224, which has an increased tip width, and the leadframe paddle 202. The tip width is increased to accommodate a lead frame groove 225 of medium width for the width of the medium passive device 222.

A large device configuration 230 has a large passive device 232 between a lead finger 234 having an increased tip width and the leadframe paddle 202 having a notch 236 for the large width of the large passive device 232. The tip width is increased for a lead finger groove 237 and one side of the notch 236 has a paddle groove 239.

A small device configuration 240 has a small passive device 242 extending between a lead finger 244, having a side extension with a lead finger groove 245 on one side, and a lead finger 246.

A large device configuration 250 has a large passive device 252 between two lead fingers 254 and 256, both of which have flared tips oppositely offset so as to accommodate the large passive device 252. The oppositely offset tips accommodate the widely separated lead finger grooves 255 and 257.

Referring now to FIG. 2B, therein is shown the structure of FIG. 2A taken along line 2B—2B. The lead finger 216 is shown with the lead finger groove 217 being a blind groove with a bottom 260. The lead finger groove 217 is filled with an electrically conductive bonding agent, such as solder 262, and the medium passive device 212 is fitted into the lead finger groove 217. The medium passive device 212 is attached thereto by the reflow of solder 262.

Referring now to FIG. 3A, therein is shown a cross-section similar to FIG. 2B of another embodiment of the present invention. The leadframe paddle 202 is provided with a blind groove 300 large enough to accommodate the integrated circuit die 203 and its bonding solder 302. The blind groove 300 helps to prevent epoxy-bleed, reduce the effective height of the integrated circuit die 203 from the bottom of the integrated circuit package 200, shorten the length of the wires 205, and improve the adhesion between the leadframe paddle 202 and the encapsulant 206. The depth of the blind groove can be the same as that of the bottom 260 by being formed by the same process as used to form the blind grooves, such as the lead finger groove 217.

Also shown in FIG. 3A is a wrap-around lead finger 304 which wraps around the outside of the encapsulant 206 so as to connect the medium passive device 212 inside the encapsulant 206 with a passive device 308 on the outside of the encapsulant 206. This enables additional passive device attachment and package stacking of additional integrated circuit die within the same package.

Figure 3B:
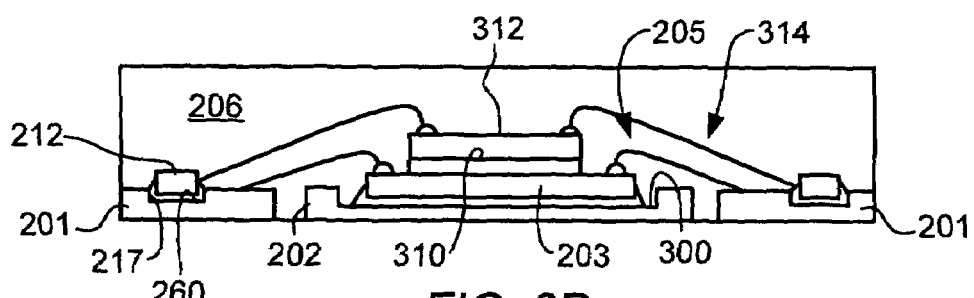
FIG. 3B is a cross-sectional view of an integrated circuit package similar to FIG. 3B of a further alternative embodiment of the present invention.

Referring now to FIG. 3B, therein is shown a structure similar to FIG. 3A in another embodiment of the present invention. The leadframe paddle 202 is provided with the blind groove 300 into which the integrated circuit die 203 is placed. A bonding adhesive 310 is deposited and a second integrated circuit die 312 is stacked over the integrated circuit die 203. Wires 314 from the second integrated circuit die 312 are connected to various of the lead fingers 201.

Figure 3C:
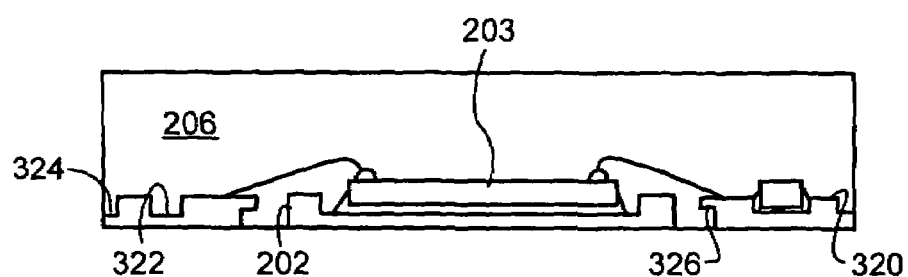
FIG. 3C is a cross-sectional view of an integrated circuit package similar to FIG. 3B of a still further alternative embodiment of the present invention.

Referring now to FIG. 3C, therein is shown a cross-sectional view similar to FIG. 3B of another embodiment of the present invention. Lead fingers 320 are provided with blind grooves 322 and 324 as well as undercuts 326 which improve adhesion between the lead fingers 320, the leadframe paddle 202, and the encapsulant 206. The blind grooves 322 can be the same blind grooves used for the lead finger grooves 217 of FIG. 3B.

Referring now to FIG. 4A, therein is shown a plan view of an integrated circuit package 400 in accordance with the present invention with an integrated circuit die and ball bonds shown by dotted lines. The integrated circuit package 400 has a number of lead fingers 401 around the perimeter thereof to which an integrated circuit die 403 is attached by ball bonds 405. The number of lead fingers 401 is representative of different types of lead fingers, which may be used in accordance with the present invention.

The lead fingers 401, the integrated circuit die 403, and the ball bonds 405 are embedded in an encapsulant 406. The lead fingers 401 and the ball bonds 405 are generally made of conductive materials, and the encapsulant 406 is of an insulating material.

A medium device configuration 410 is shown with a medium passive device 412 extending between lead fingers 414 and 416 having straight tips and lead finger grooves 415 and 417, respectively.

A small device configuration 420 has a small passive device 422 extending between a lead finger 424, having a tip extension on one side, and a lead finger 426 with a straight tip.

A corner configuration 430 includes a passive device 432 between an extended, long lead finger 434 and an extended, long lead finger 436 having a widened tip as required to accommodate the passive device 432. Where the lead fingers generally are parallel one to another, the extended, long lead finger 434 and the extended, long lead finger 436 extend perpendicular one to another. The extended, long lead finger 434 has a wide groove 435 on one side and the extended, long lead finger 436 has an offset tip with a groove 437.

A large device configuration 440 has a large passive device 442 between two lead fingers 444 and 446, both of which have their tips oppositely offset so as to accommodate the large passive device 442 between lead finger grooves 445 and 447.

Referring now to FIG. 4B, therein is shown the structure of FIG. 4A along line 4B—4B. The integrated circuit package 400 has the lead finger 416 with a blind groove 450 containing the medium passive device 412 and solder 452. The ball bonds 405 support the integrated circuit die 403, often referred to as a flip chip, in the encapsulant 406. The flip chip has contacts on top and is flipped to the position shown.

The integrated circuit package 400 also includes a solder mask 454 having openings therein for further ball bonds 456 to extend therethrough. The integrated circuit package 400 is often referred to as a ball grid array (BGA).

Figure 5A:
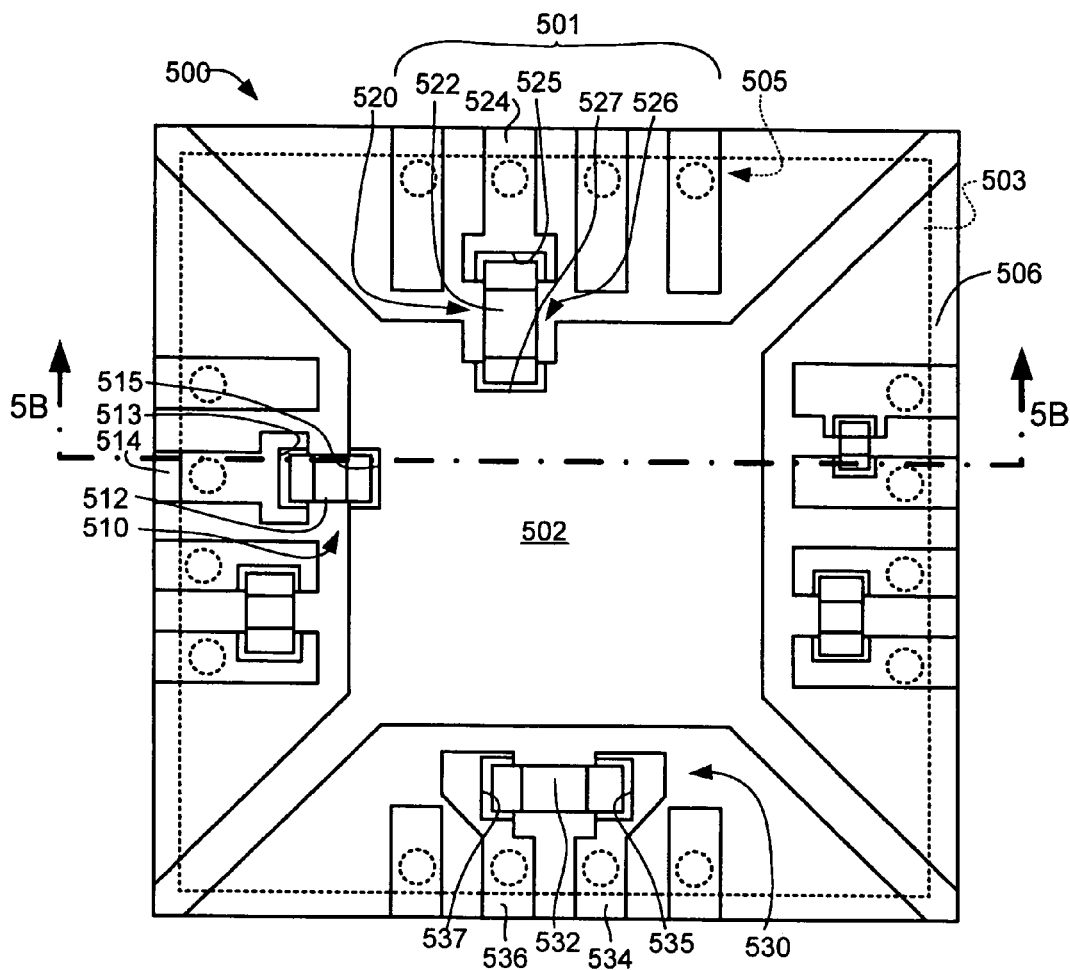
FIG. 5A is a plan view of an integrated circuit package according to a still further embodiment of the present invention.

Referring now to FIG. 5A, therein is shown a plan view of an integrated circuit package 500 according to a still further embodiment of the present invention with an integrated circuit die and ball bonds shown by dotted lines. The integrated circuit package 500 has a number of lead fingers 501 around the perimeter thereof to which an integrated circuit die 503 is attached by ball bonds 505. The lead fingers 501 are representative of different types of lead fingers, which may be used in accordance with the present invention.

The lead fingers 501, a leadframe paddle 502, an integrated circuit die 503, and the ball bonds 505 are embedded in an encapsulant 506. The lead fingers 501, the leadframe paddle 502, and the ball bonds 505 are generally made of conductive materials, and the encapsulant 506 is of an insulating material.

In FIG. 5A, grooves are formed in the lead fingers 501 and/or the leadframe paddle 502.

A medium device configuration 510 is shown with a medium passive device 512 extending between a lead finger 514, having an increased tip width, and the leadframe paddle 502 having a lead finger groove 513 and a paddle groove 515, respectively.

A large device configuration 520 has a large passive device 522 between a lead finger 524 having an increased tip width and the leadframe paddle 502 having a notch 526 to accommodate the large passive device 522. The lead finger 524 has a lead finger groove 525 and the leadframe paddle 502 has a paddle groove 527 at one side of the notch 526.

A large device configuration 530 has a large passive device 532 between oppositely enlarged lead fingers 534 and 536 having increased tip widths and notches to accommodate the large passive device 532. The oppositely enlarged lead fingers 534 and 536 have lead finger grooves 535 and 537, respectively.

Figure 5B:
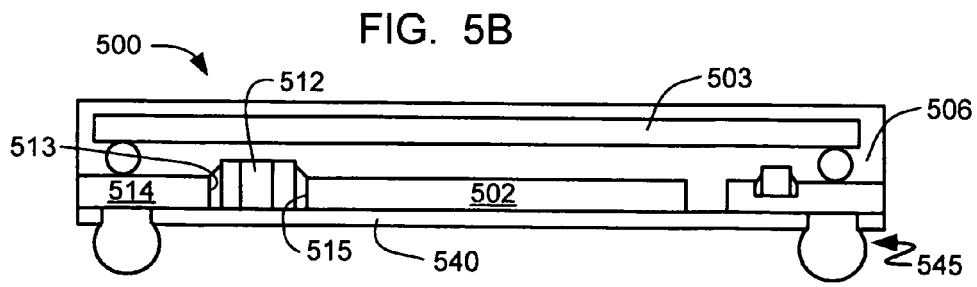
FIG. 5B is a cross-sectional view of the structure of FIG. 5A taken along line 5B—5B.

Referring now to FIG. 5B, therein is shown the structure of FIG. 5A along line 5B—5B. The integrated circuit package 500 has the lead finger groove 513 and the paddle groove 515 extending through the lead finger 514 and the leadframe paddle 502, respectively, to a solder mask 540. This permits the medium passive device 512 to be thicker for the same plan view configuration.

The integrated circuit package 500 also includes the solder mask 540 for further ball bonds 545, which extend downward therefrom.

The integrated circuit package 500 further is able to make use of the leadframe paddle 502 as a ground plane and/or a heat-spreading plane.

Figure 6A:
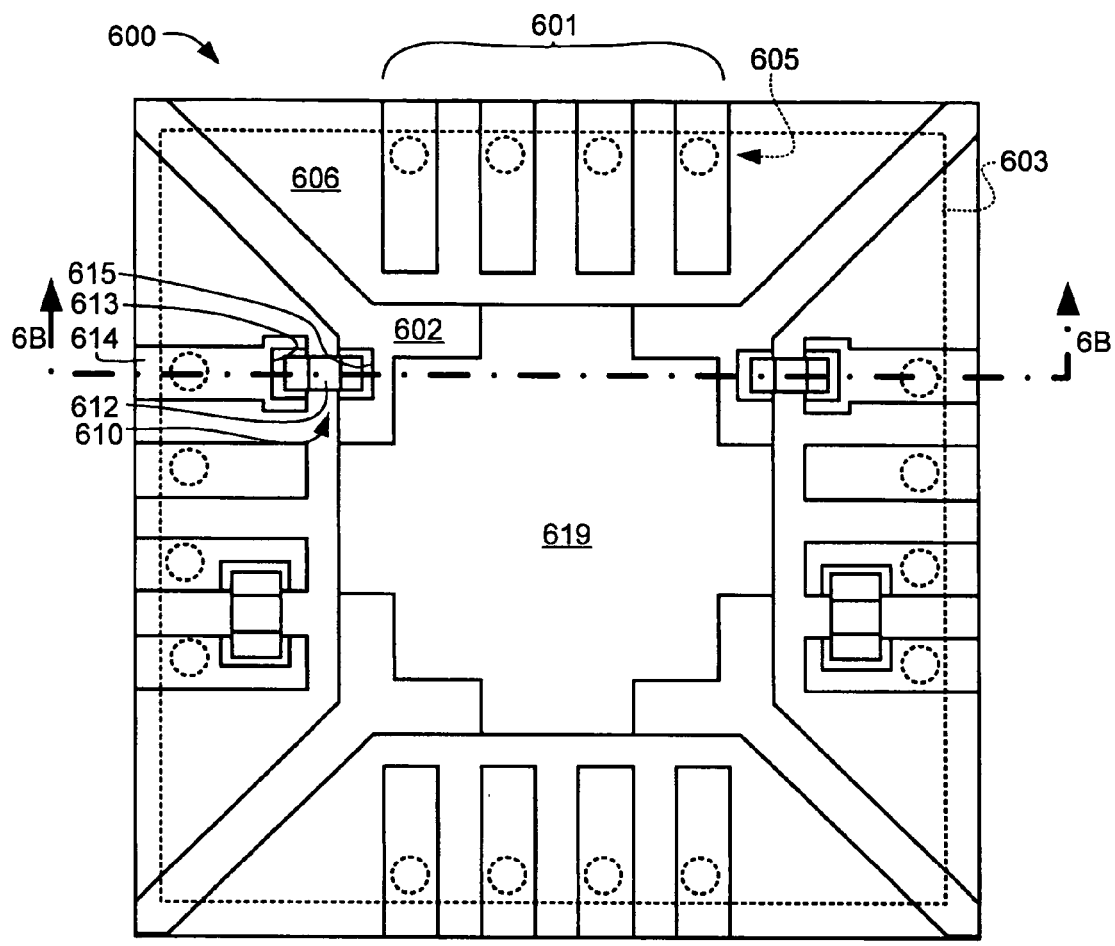
FIG. 6A is a plan view of an integrated circuit package according to another embodiment of the present invention.

Referring now to FIG. 6A, therein is shown a plan view of an integrated circuit package 600 according to another embodiment of the present invention with an integrated circuit die and ball bonds shown by dotted lines. The integrated circuit package 600 has a number of lead fingers 601 around the perimeter thereof to which an integrated circuit die 603 is attached by ball bonds 605. The lead fingers 601 are representative of different types of lead fingers, which may be used in accordance with the present invention.

The integrated circuit package 600 further includes a leadframe paddle 602, which can be of various configurations, upon which the integrated circuit die 603 is also attached. The lead fingers 601, the leadframe paddle 602, the integrated circuit die 603, and the ball bonds 605 are embedded in an encapsulant 606. The lead fingers 601, the leadframe paddle 602, and the ball bonds 605 are generally made of conductive materials, and the encapsulant 606 is of an insulating material.

In FIG. 6A, a medium device configuration 610 is shown with a medium passive device 612 extending between a lead finger 614 and the leadframe paddle 602. The lead finger 614 has a lead finger groove 613 and the leadframe paddle 602 has a paddle groove 615.

The leadframe paddle 602 also has a groove or a relief 619. The relief 619 can be of any configuration but is shown as a broad cross.

Figure 6B:
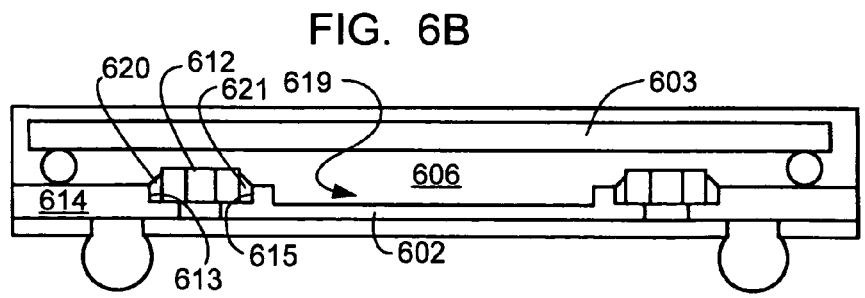
FIG. 6B is a cross-sectional view of the structure of FIG. 6A taken along line 6B—6B.

Referring now to FIG. 6B, therein is shown the structure of FIG. 6A taken along line 6B—6B, which better shows the relief 619. The relief 619 provides better moldability for the encapsulant 606. The ungrooved or unrelieved portions of the leadframe paddle 602 are sufficiently thick to permit the usual blind and through-grooves for attachment of passive devices. The leadframe paddle 602 can continue to act as a ground plane and/or heat-spreading plane. The medium passive device 612 is held in the lead finger groove 613 and the paddle groove 615 by conductive adhesive 620 and 621, respectively.

Figure 7A:
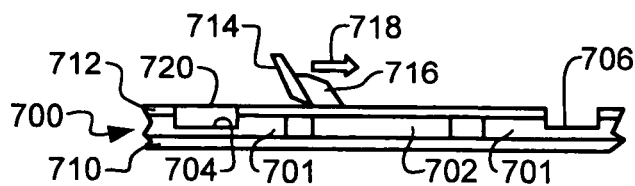
FIG. 7A is an intermediate step in manufacturing a wire-bonded integrated circuit package in accordance with the present invention.

Referring now to FIG. 7A, therein is shown a method for manufacturing a wire-bonded integrated circuit package in accordance with an embodiment of the present invention. A leadframe 700 has lead fingers 701 and a leadframe paddle

702. The lead fingers 701 have blind grooves 704 and 706 provided therein. The leadframe 700 is on an adhesive tape 710 and is covered by a stencil 712 having openings matching the blind grooves 704 and 706. A doctor blade 714 is shown drawing solder paste 716 across the surface of the stencil 712 in the direction indicated by the arrow 718. Solder paste 720 fills the blind groove 704.

Referring now to 7B, therein is shown the structure of FIG. 7A after removal of the stencil 712 and positioning of the passive devices 722 and 724 and reflow soldering to convert the solder paste 716 into solder to hold the passive devices 722 and 724 in place.

Figure 7B:
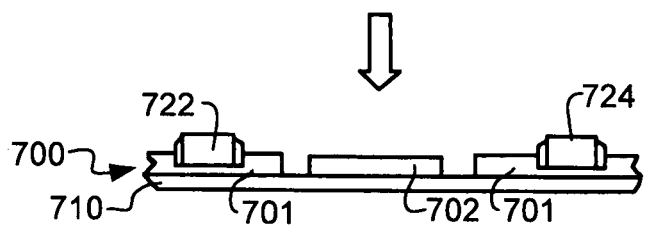
FIG. 7B is the structure of FIG. 7A after removing a stencil, positioning the passive devices, and reflow soldering.
Figure 7C:
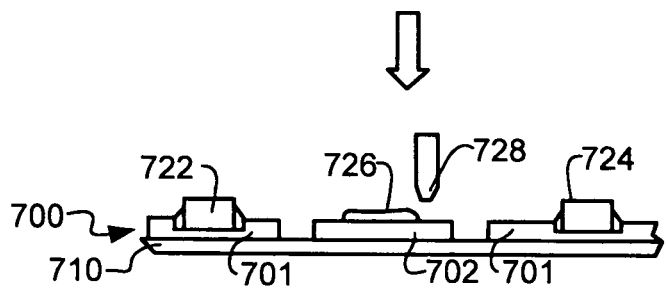
FIG. 7C is the structure of FIG. 7B after deposition of a bonding compound.

Referring now to FIG. 7C, therein is shown the structure of FIG. 7B after deposition of a heat conductive bonding compound 726, such as an epoxy, from a nozzle 728.

Figure 7D:
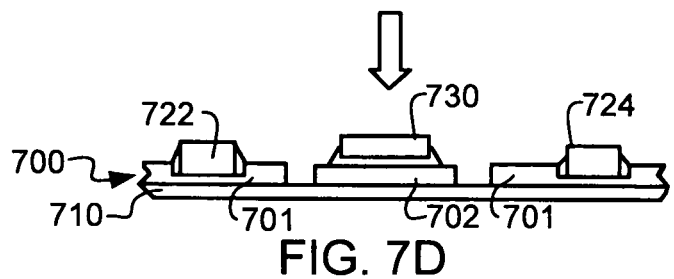
FIG. 7D is the structure of FIG. 7C after positioning a wire-bonded integrated circuit die.

Referring now to FIG. 7D, therein is shown the structure of FIG. 7C after positioning of a wire-bonded integrated circuit die 730.

Figure 7E:
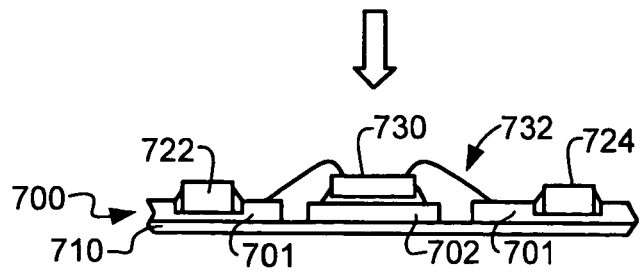
FIG. 7E is the structure of FIG. 7D after bonding wires between a wire-bonded integrated circuit die and lead fingers.

Referring now to FIG. 7E, therein is shown the structure of FIG. 7D after bonding wires 732 between the wire-bonded integrated circuit die 730 to the lead fingers 701.

Figure 7F:
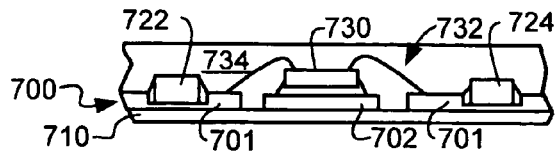
FIG. 7F is the structure of FIG. 7E after deposition of an encapsulant.

Referring now to FIG. 7F, therein is shown the structure of FIG. 7E after deposition of an encapsulant 734. Depending upon the encapsulant 734, the encapsulant material can be molded and cured.

Figure 7I:
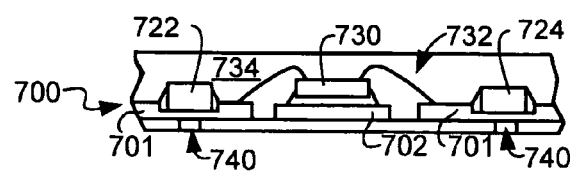
FIG. 7I is the structure of FIG. 7F in an alternate embodiment showing the formation of solder balls.
Figure 7G:
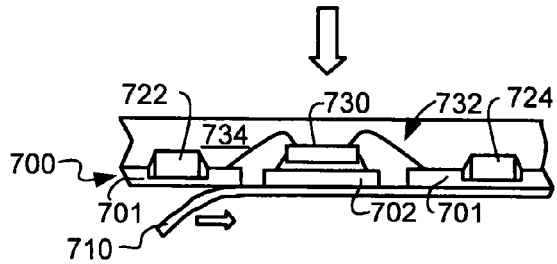
FIG. 7G is the structure of FIG. 7F after de-tape or removal of the adhesive tape.

Referring now to FIG. 7G, therein is shown the structure of FIG. 7F after de-tape, or removal of the adhesive tape 710.

Figure 7J:
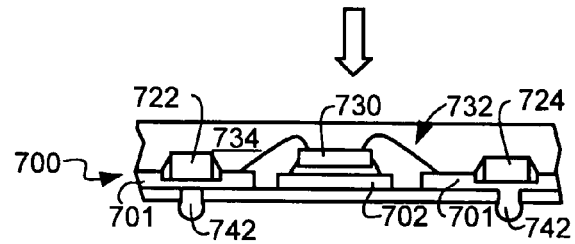
FIG. 7J is the structure of FIG. 7I after attaching solder balls and reflowing to form a ball grid array.
Figure 7H:
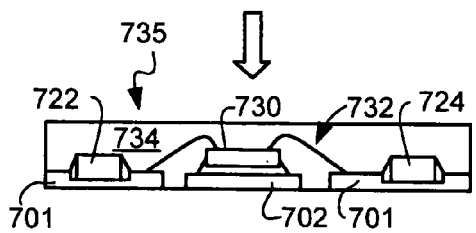
FIG. 7H is the structure of FIG. 7G after singulation.

Referring now to FIG. 7H, therein is shown the structure of FIG. 7G after singulation. Singulation is the process by which each individual integrated circuit package is cut from a strip into an individual integrated circuit package 735 for a leadless package.

Referring now to FIG. 7I, therein is shown the structure of FIG. 7F in an alternate embodiment showing the formation of a BGA package. In FIG. 7I, openings or apertures 740 in the adhesive tape 710, or a solder mask, are formed by chemical etching, photolithographic processing, or laser cutting.

Referring now to FIG. 7J, therein is shown the structure of FIG. 7I after attaching solder balls 742 and reflowing to form a BGA package.

Figure 7K:
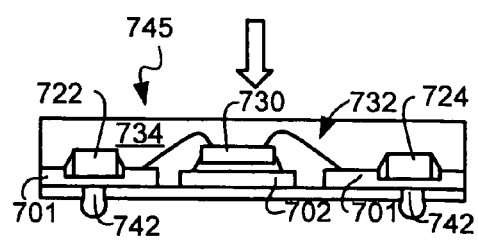
FIG. 7K is the structure of FIG. 7J after singulation to form an individual integrated circuit package for a wire-bonded ball grid array package.

Referring now to FIG. 7K, therein is shown the structure of FIG. 7J after singulation to form an individual integrated circuit package 745 for a wire-bonded BGA package.

Figure 8A:
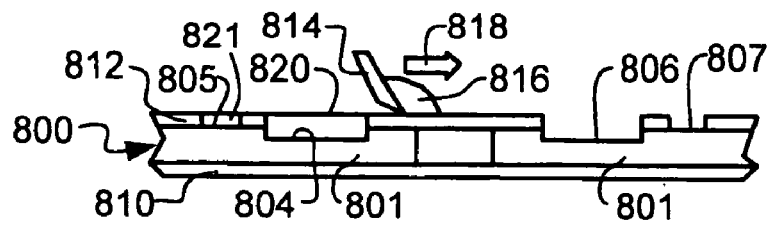
FIG. 8A is an intermediate step in manufacturing a ball-bonded integrated circuit package in accordance with another alternative embodiment of the present invention.

Referring now to FIG. 8A, therein is shown a method for manufacturing a BGA integrated circuit package in accordance with another alternate embodiment of the present invention. A leadframe 800 has lead fingers 801 that have blind grooves 804 and 806 provided therein. The leadframe 800 is on an adhesive tape 810 and is covered by a stencil 812. The stencil 812 has apertures or openings 805 and 807 through to the lead fingers 801. A doctor blade 814 is shown drawing solder paste 816 across the surface of the stencil 812 in the direction indicated by the arrow 818. The solder paste 816 fills the blind groove 804 to form solder paste 820 and the opening 805 to form solder paste 821.

Figure 8B:
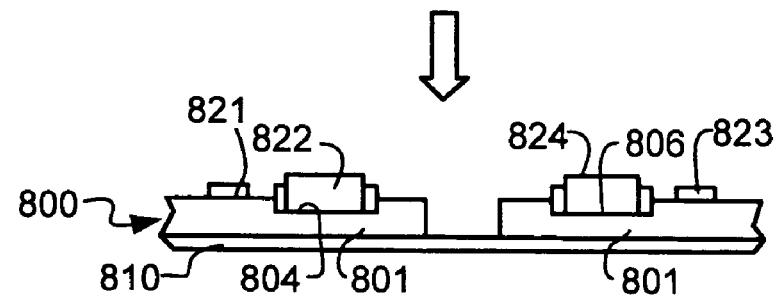
FIG. 8B is the structure of FIG. 8A after removal of a stencil and leaving solder paste.

Referring now to FIG. 8B, therein is shown the structure of FIG. 8A after the removal of the stencil 812 to leave the solder paste 821 and 823. Passive devices 822 and 824 are then positioned in the respective blind grooves 804 and 806.

Figure 8C:
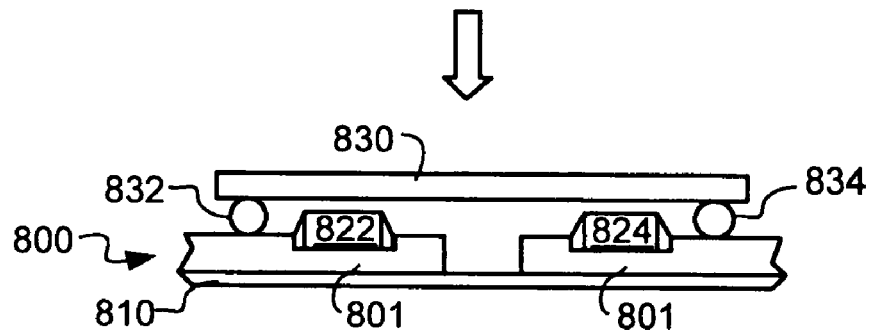
FIG. 8C is the structure of FIG. 8B after attachment of a ball-bonded integrated circuit.

Referring now to FIG. 8C, therein is shown the structure of FIG. 8B after a ball-bonded integrated circuit die 830 is attached by reflowing the solder paste 821 and 823 into ball bonds 832 and 834. The reflow attaches the passive devices 822 and 824 to the lead fingers 801.

Figure 8D:
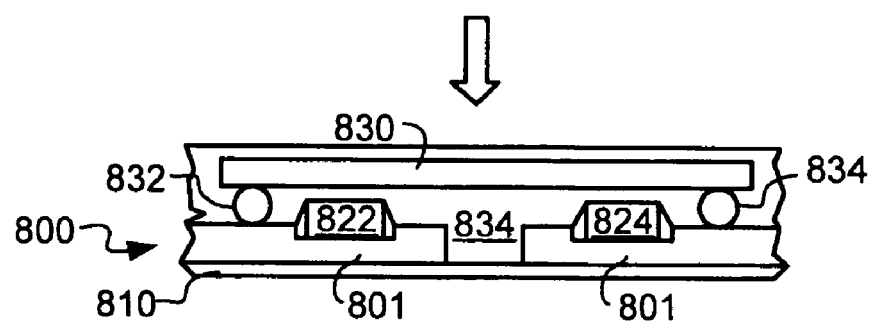
FIG. 8D is the structure of FIG. 8C after encapsulation.

Referring now to FIG. 8D, therein is shown the structure of FIG. 8C after encapsulation in an encapsulant 836.

Figure 8E:
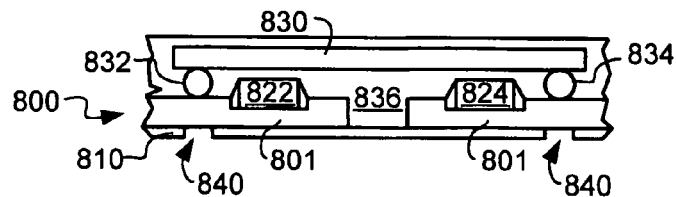
FIG. 8E is the structure of FIG. 8D after formation of apertures in the adhesive tape.

Referring now to FIG. 8E, therein is shown the structure of FIG. 8D after the formation of apertures 840 in the adhesive tape 810.

Figure 8F:
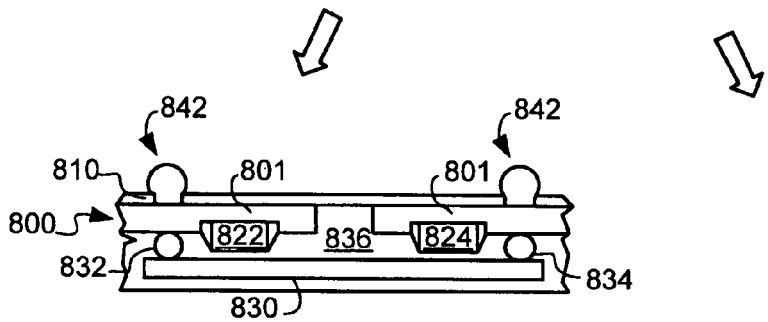
FIG. 8F is the structure of FIG. 8E inverted for ball attach and reflow of solder balls in the apertures.

Referring now to FIG. 8F, therein is shown the structure of FIG. 8E inverted for ball attach and reflow of solder balls 842 in the apertures 840 of FIG. 8E.

Figure 8H:
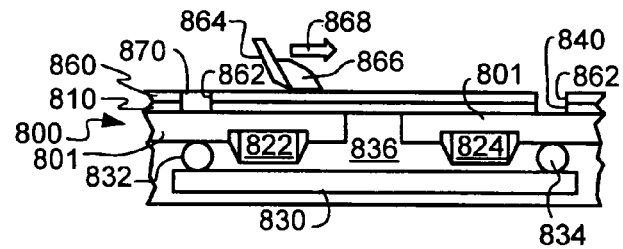
FIG. 8H is the structure of FIG. 8E in an alternate method of manufacture in accordance with the present invention.
Figure 8G:
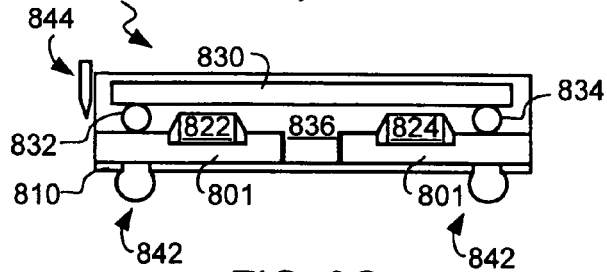
FIG. 8G is the structure of FIG. 8F inverted and singulated to form a ball-bonded BGA package.

Referring now to FIG. 8G, therein is shown the structure of FIG. 8F inverted and singulated by a blade 844 to form a BGA package 850.

Referring now to FIG. 8H, therein is shown the structure of FIG. 8E in an alternate method of manufacture in accordance with the present invention. The structure of FIG. 8E is inverted. A stencil 860 is positioned over the adhesive tape 810 with holes 862 lined up with the apertures 840. A doctor blade 864 is shown drawing solder paste 866 across the surface of the stencil 860 in the direction indicated by the arrow 868. Solder paste 870 fills the apertures 840 and the holes 862.

Figure 8I:
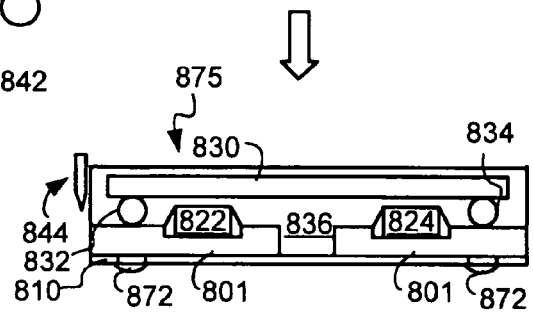
FIG. 8I is the structure of FIG. 8H after singulation to form the ball-bonded integrated circuit package for a solder attach.

Referring now to FIG. 8I, therein is shown the structure of FIG. 8H after removal of the stencil 860 of FIG. 8H and reflow of the solder paste 870 to form solder bumps 872. The structure has been inverted and singulated by the blade 844 to form a solder attach integrated circuit package 875.

Figure 9A:
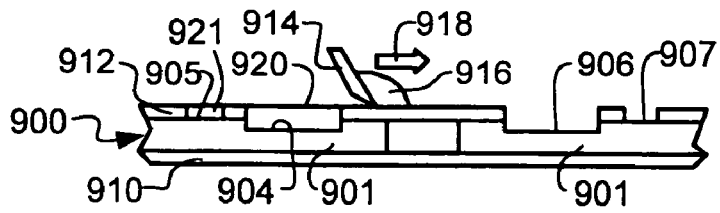
FIG. 9A is an intermediate step in manufacturing a ball-bonded integrated circuit package in accordance with still another alternative embodiment of the present invention.

Referring now to FIG. 9A, therein is shown a method for manufacturing a BGA integrated circuit package in accordance with another alternate embodiment of the present invention. The leadframe 900 has lead fingers 901 that have blind grooves 904 and 906 provided therein. The leadframe 900 is on an adhesive tape 910 and is covered by a stencil 912. The stencil 912 has apertures or openings 905 and 907 through to the lead fingers 901. A doctor blade 914 is shown drawing solder paste 916 across the surface of the stencil 912 in the direction indicated by the arrow 918. The solder paste 916 fills the blind groove 904 to form solder paste 920 and the opening 905 to form solder paste 921.

Figure 9B:
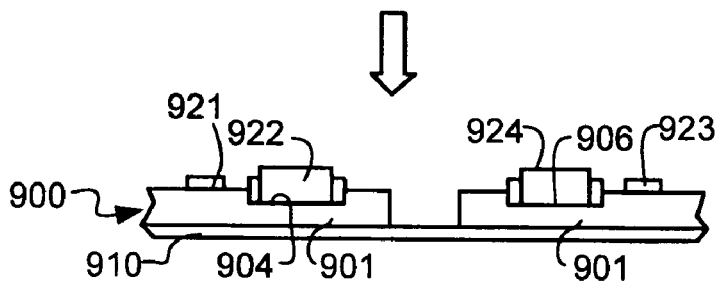
FIG. 9B is the structure of FIG. 9A after removal of a stencil leaving solder paste.

Referring now to FIG. 9B, therein is shown the structure of FIG. 9A after the removal of the stencil 912 to leave the solder paste 921 and 923. Passive devices 922 and 924 are then positioned in the respective blind grooves 904 and 906.

Figure 9C:
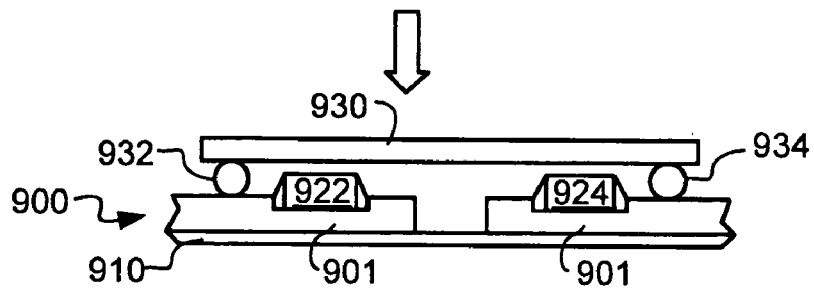
FIG. 9C is the structure of FIG. 9B after a ball-bonded integrated circuit die is attached, ball bonds formed, and passive devices reflowed into position.

Referring now to FIG. 9C, therein is shown the structure of FIG. 9B after a ball-bonded integrated circuit die 930 is attached by reflowing the solder paste 921 and 923 into ball bonds 932 and 934. The reflow attaches the passive devices 922 and 924 to the lead fingers 901.

Figure 9D:
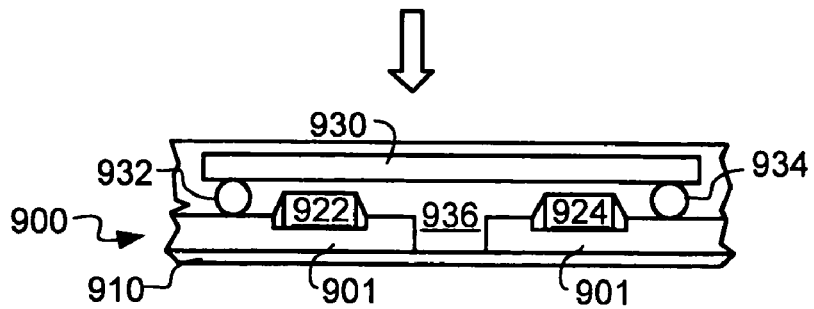
FIG. 9D is the structure of FIG. 9C after encapsulation in an encapsulant.

Referring now to FIG. 9D, therein is shown the structure of FIG. 9C after encapsulation in an encapsulant 936.

Figure 9E:
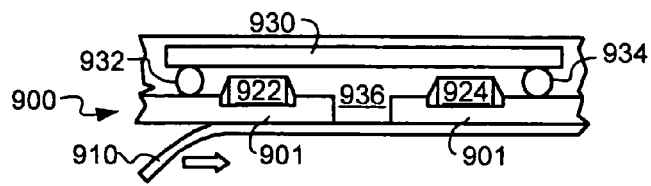
FIG. 9E is the structure of FIG. 9D after de-tape or removal of the adhesive tape.

Referring now to FIG. 9E, therein is shown the structure of FIG. 9D after de-tape, or removal of the adhesive tape 910. Thereafter, a leadless ball-bonded integrated circuit package can be formed in a singulation process.

Figure 9F:
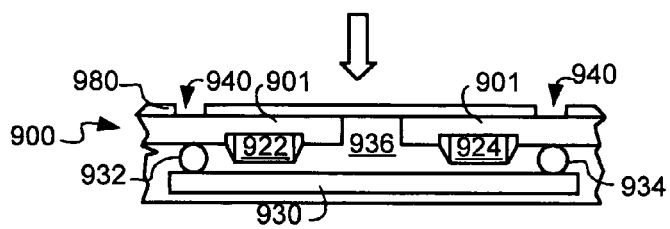
FIG. 9F is the structure of FIG. 9E in an alternate embodiment showing formation of solder balls.

Referring now to FIG. 9F, therein is shown the structure of FIG. 9E after the attachment of a dielectric layer 980, such as solder mask, to the leadframe 900. Openings or apertures 940 are formed in the dielectric layer 980 by chemical etching, photolithographic processing, or laser cutting.

Figure 9G:
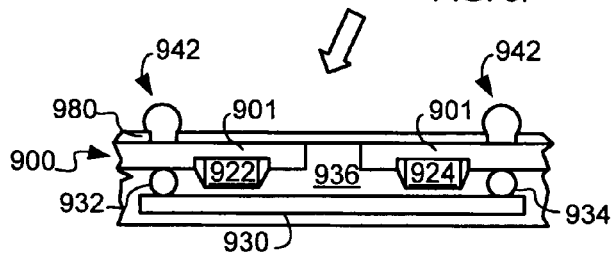
FIG. 9G is the structure of FIG. 9F inverted for ball attach and reflow of the solder balls in the apertures.

Referring now to FIG. 9G, therein is shown the structure of FIG. 9F in an alternate embodiment showing the formation of a BGA package. The structure of FIG. 9G is inverted for ball attach and reflow of the solder balls 942 in the apertures 940 of FIG. 9F.

Figure 9I:
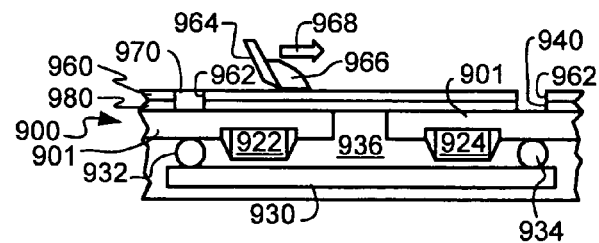
FIG. 9I is the structure of FIG. 9F in an alternate method of manufacture in accordance with the present invention.
Figure 9H:
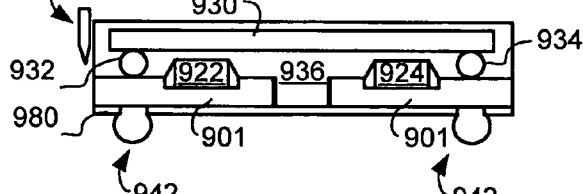
FIG. 9H is the structure of FIG. 9F inverted and singulated to form a ball-bonded ball grid array package.

Referring now to FIG. 9H, therein is shown the structure of FIG. 9F inverted and singulated by a blade 944 to form a BGA package 950.

Referring now to FIG. 9I, therein is shown the structure of FIG. 9F in an alternate method of manufacture in accordance with the present invention. The structure of FIG. 9F is inverted. A stencil 960 is positioned over the dielectric layer 980 with holes 962 lined up with the apertures 940. A doctor blade 964 is shown drawing solder paste 966 across the surface of the stencil 960 in the direction indicated by the arrow 968. Solder paste 970 fills the apertures 940 and the holes 962.

Figure 9J:
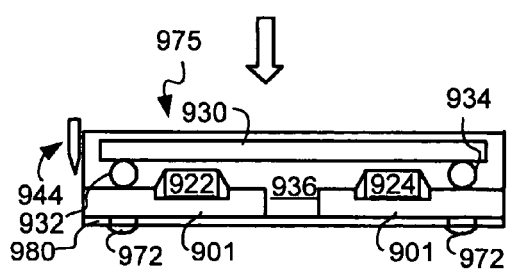
FIG. 9J is the structure of FIG. 9I after singulation to form the ball-bonded integrated circuit package for a solder attach.

Referring now to FIG. 9J, therein is shown the structure of FIG. 9I 8H after removal of the stencil 960 of FIG. 8H and reflow of the solder paste 970 to form solder bumps 972. The structure has been inverted and singulated by the blade 944 to form a solder attach integrated circuit package 975.

Figure 10A:
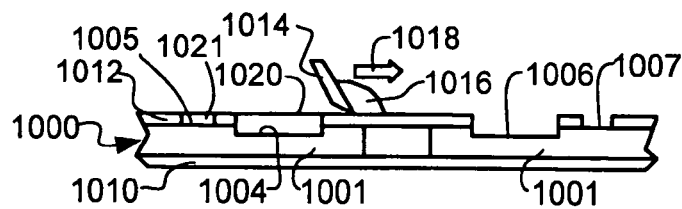
FIG. 10A is a method for manufacturing a ball-bonded integrated circuit package in accordance with another alternative embodiment of the present invention.

Referring now to FIG. 10A, therein is shown a method for manufacturing a ball-bonded integrated circuit package in accordance with another alternative embodiment of the present invention. The leadframe 1000 has lead fingers 1001 and a leadframe paddle 1002. The lead fingers 1001 have blind grooves 1004 and 1006 provided therein. The leadframe 1000 is on an adhesive tape 1010 and is covered by a stencil 1012. A doctor blade 1014 is shown drawing solder paste 1016 across the surface of the stencil 1012 in the direction indicated by the arrow 1018. Solder paste 1020 fills the blind groove 1004.

Figure 10B:
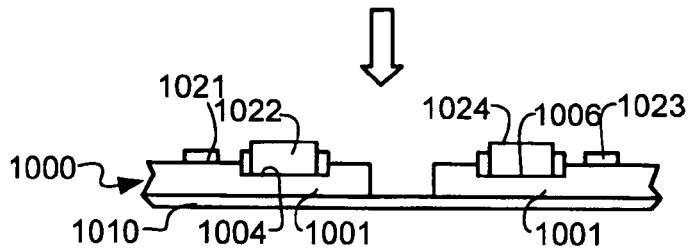
FIG. 10B is the structure of FIG. 10A after the removal of the stencil leaving the solder paste.

Referring now to FIG. 10B, therein is shown the structure of FIG. 10A after the removal of the stencil 1012 to leave the solder paste 1021. The passive devices 1022 and 1024 are then positioned in the respective grooves 1004 and 1006.

Figure 10C:
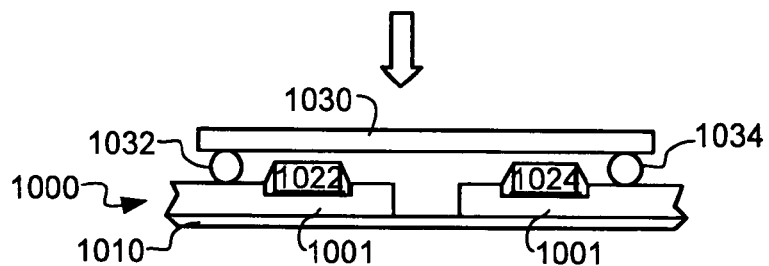
FIG. 10C is the structure of FIG. 10B after a ball-bonded integrated circuit die is attached, ball bonds formed, and passive devices reflowed into position.

Referring now to FIG. 10C, therein is shown the structure of FIG. 10B after a ball-bonded integrated circuit die 1030 is attached and the ball bonds 1032 are formed and the passive devices 1022 and 1024 are reflowed into position.

Figure 10D:
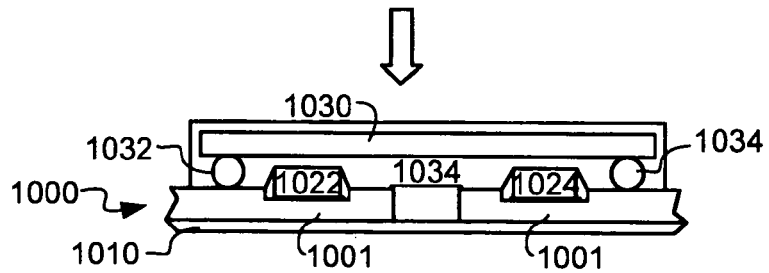
FIG. 10D is the structure of FIG. 10C after encapsulation.

Referring now to FIG. 10D, therein is shown the structure of FIG. 10C after encapsulation in an encapsulant 1034. The encapsulant 1034 is molded around each ball-bonded integrated circuit die 1030.

Figure 10E:
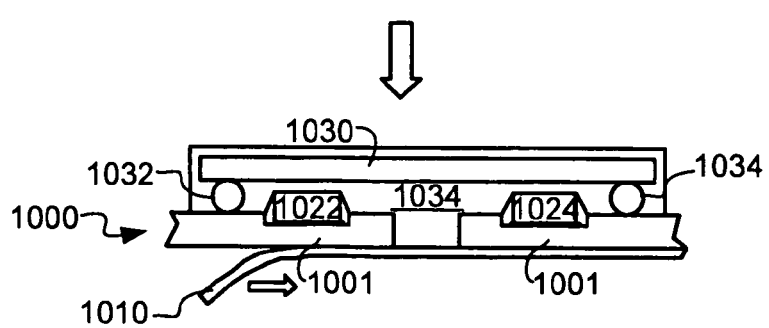
FIG. 10E is the structure of FIG. 10D after de-tape or removal of the adhesive tape.

Referring now to FIG. 10E, therein is shown the structure of FIG. 10D after de-tape, or removal of the adhesive tape 1010.

Figure 10F:
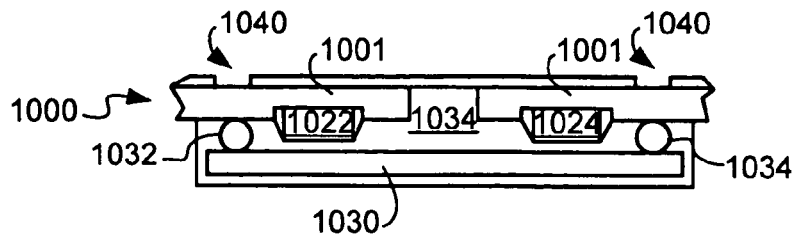
FIG. 10F is the structure of FIG. 10D in an alternate embodiment showing the formation of solder balls.

Referring now to FIG. 10F, therein is shown the structure of FIG. 10D after the attachment of a dielectric layer 1080, such as solder mask, to the leadframe 900. Openings or apertures 1040 in the dielectric layer 1080 are formed by chemical etching, photolithographic processing, or laser cutting.

Figure 10G:
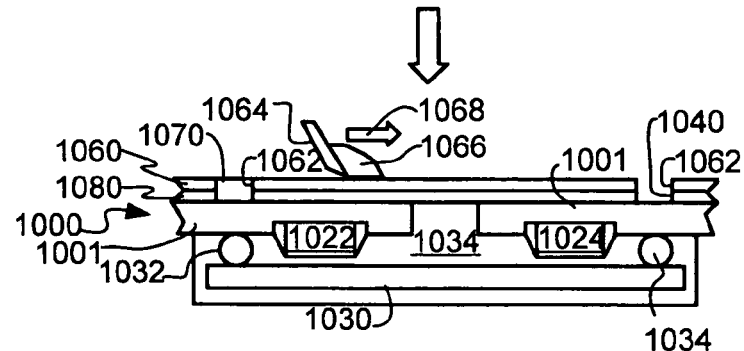
FIG. 10G is the structure of FIG. 10F in an alternate method of manufacture in accordance with the present invention.

Referring now to FIG. 10G, therein is shown the structure of FIG. 10F in an alternate method of manufacture in accordance with the present invention. The structure of FIG. 10F is inverted. A stencil 1060 is positioned over the adhesive tape 1010 with holes 1062 lined up with the apertures 1040. A doctor blade 1064 is shown drawing solder paste 1066 across the surface of the stencil 1060 in the direction indicated by the arrow 1068. Solder paste 1070 fills the apertures 1040 and the holes 1062.

Figure 10H:
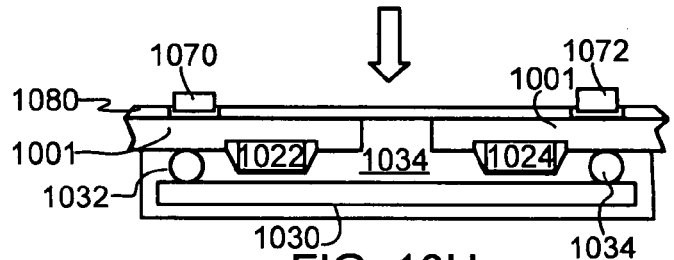
FIG. 10H the structure of FIG. 10G after attachment of passive devices and reflow soldering.

Referring now to FIG. 10H, therein is shown the structure of FIG. 10G after attachment of passive devices 1070 and 1072 and reflow soldering.

Figure 10I:
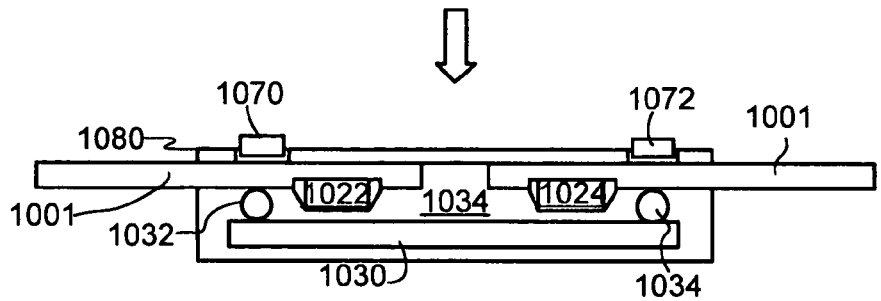
FIG. 10I is the structure of FIG. 10H showing trim and dam-bar cut.

Referring now to FIG. 10I, therein is shown the structure of FIG. 10H after trim and dam-bar cut of the lead fingers 1001 to a wrap around length. The dambar cut is performed to cut off any joints, which may provide pre-encapsulation support for the lead fingers.

Figure 10J:
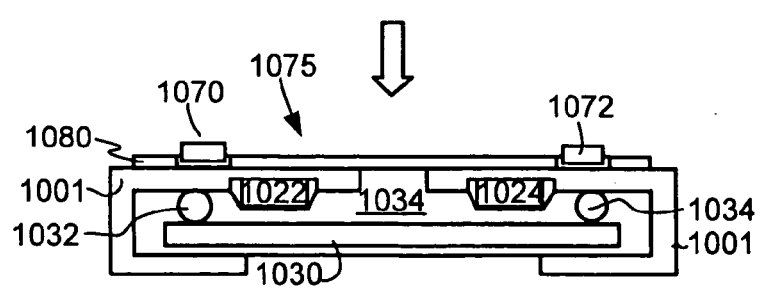
FIG. 10J is the structure of FIG. 10I after forming lead fingers into external leads.

Referring now to FIG. 10J, therein is shown the structure of FIG. 10I after the forming of the lead fingers 1001 into wrap-around external leads to provide an external lead integrated circuit package 1075.

Figure 11A:
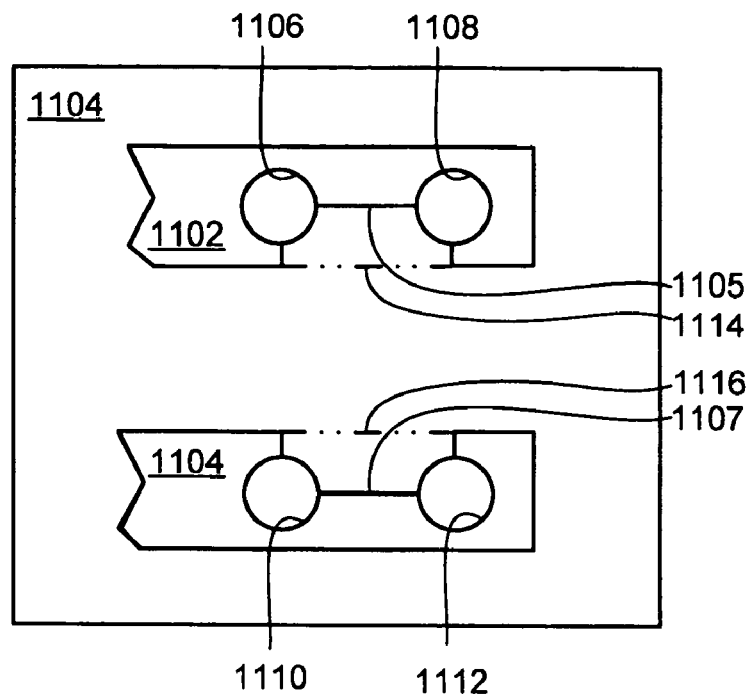
FIG. 11A is a close-up view of a leadframe with a groove in accordance with the present invention.

Referring now to FIG. 11A, therein is shown a close-up view of lead fingers 1100 and 1102 shown on an adhesive tape 1104. The lead finger 1100 has a lead finger groove 1105 with solder paste reservoirs 1106 and 1108 at the two corners filled with solder paste before reflowing. The lead finger 1102 has a lead finger groove 1107 with solder paste reservoirs 1110 and 1112 at the two corners filled with solder paste before reflowing. The lead finger grooves 1105 and 1106 are shown as through grooves but can also be blind grooves, as indicated by the phantom lines 1114 and 1116, respectively.

Figure 11B:
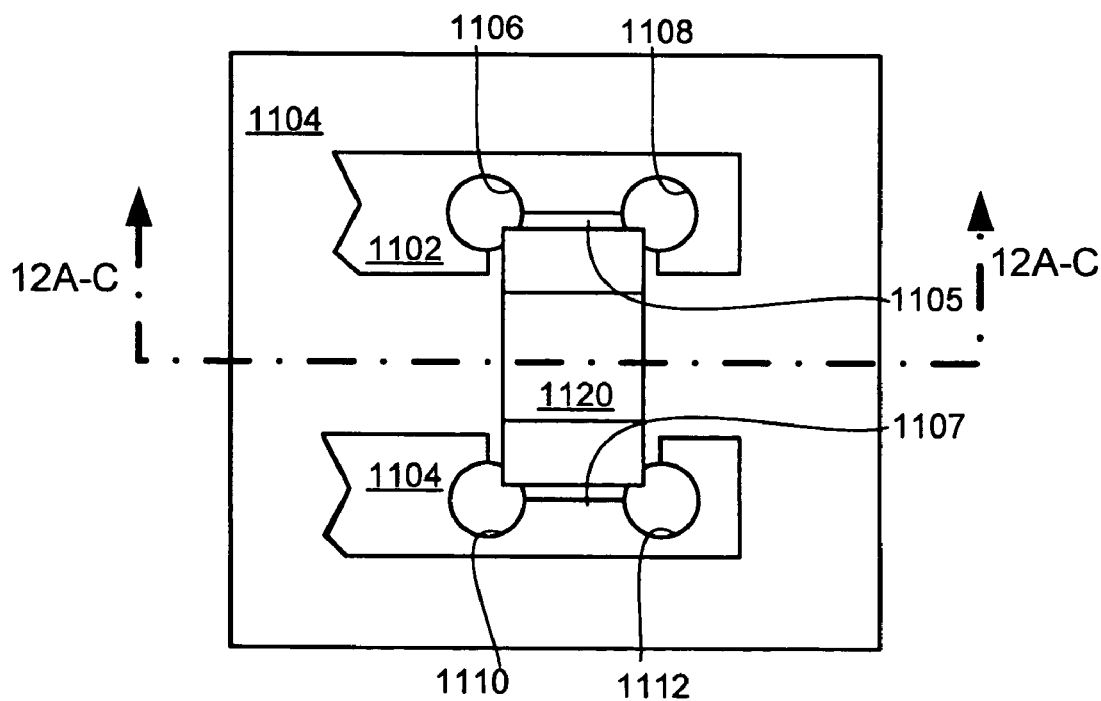
FIG. 11B is the structure of FIG. 11A having a passive device in the solder.

Referring now to FIG. 11B, therein is shown the structure of FIG. 11A having a passive device 1120 in the solder formed after reflow soldering of the solder paste which has been printed or dispensed.

Figure 12A:
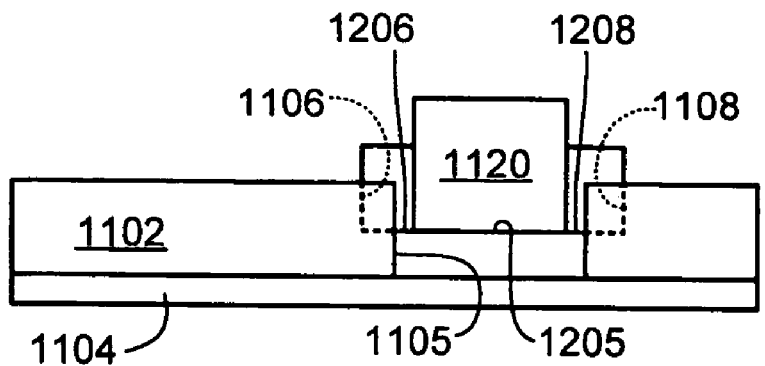
FIG. 12A is one embodiment of a cross-section of FIG. 11B taken along line 12A—12A.

Referring now to FIG. 12A, therein is shown one embodiment of the cross-section of FIG. 11B taken along line 12A—12A. The passive device 1120 is in the lead finger groove 1105 having a bottom 1205 and the solder paste is in the reservoirs 1106 and 1108 having respective bottoms 1206 and 1208.

Figure 12B:
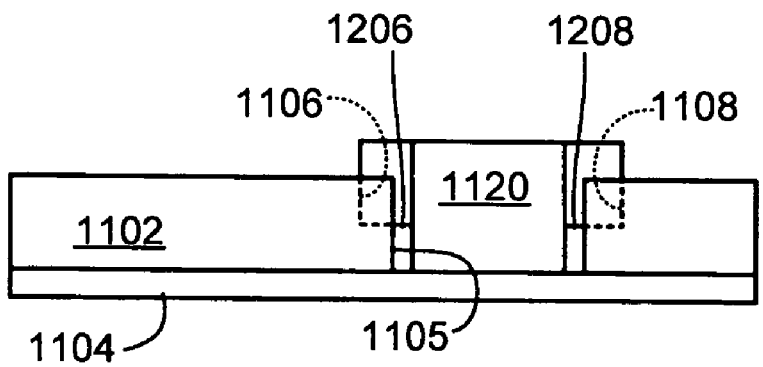
FIG. 12B is another embodiment of the cross-section of FIG. 11B taken along line 12B—12B.

Referring now to FIG. 12B, therein is shown another embodiment of the cross-section of FIG. 11B taken along line 12B—12B. The passive device 1120 is in the lead finger groove 1105 without a bottom and the solder paste is in the reservoirs 1106 and 1108 having respective bottoms 1206 and 1208.

Figure 12C:
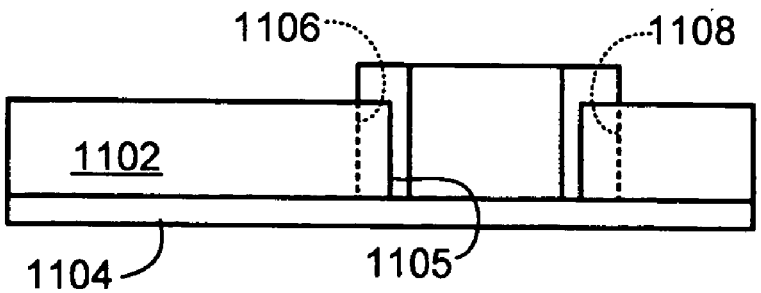
FIG. 12C is a further embodiment of the cross-section of FIG. 11B taken along line 12C—12C.

Referring now to FIG. 12C, therein is shown another embodiment of the cross-section of FIG. 11B taken along line 12C—12C. The passive device 1120 is in the lead finger groove 1105 without a bottom and the solder paste is in the reservoirs 1106 and 1108 without bottoms.

Referring now to FIG. 13, therein is shown a close-up plan view of the passive device 1120 showing solder 1300 filling the gaps between the passive device 1120 and the lead fingers 1100 and 1102. The solder 1300 fills the gap by capillary effect during solder reflow.

Referring now to FIG. 14, therein is shown a method 1400 for forming an integrated circuit package in accordance with the present invention. The method 1400 comprises: a block 1402 of providing a leadframe having lead fingers; a block 1404 of forming a groove in a lead finger; in a block 1406 of placing a conductive bonding agent in the groove; and a block 1408 of placing an electronic device in the groove to be held by the conductive bonding agent.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for forming an integrated circuit package, comprising:
   providing a leadframe having a lead finger;
   forming a groove in the lead finger;
   placing a conductive bonding agent in the groove;
   placing an electronic device in the groove to be held by the conductive bonding agent;
   providing a leadframe paddle;
   forming a groove in the leadframe paddle;
   placing a conductive bonding agent in the groove; and
   placing the electronic device in the groove to be held by the conductive bonding agent.

2. The method as claimed in claim 1 wherein providing the leadframe provides the lead finger having a tip of at lean one of the configurations of straight, increased width, side extension, flared, offset, extended, or a combination thereof.

3. The method as claimed in claim 1 further comprising forming the lead finger into an external lead around at least a portion of the integrated circuit package.

4. The method as claimed in claim 1 wherein forming the groove includes forming a reservoir for the conductive bonding agent adjacent to the groove.

5. The method as claimed in claim 1 further comprising:
   bonding an integrated circuit die by at least one of wire or ball to the lead finger; and
   forming at least one of a solder bump or a ball grid array ball on the lead finger.

6. A method for forming an integrated circuit package, comprising:
   providing a leadframe having lead fingers extending at least one of parallel, perpendicular, and a combination thereof one to another;
   forming blind or through grooves in the lead fingers;
   placing a conductive bonding agent in the blind or through grooves;
   placing a passive device in the blind or through grooves to be held by the conductive bonding agent, the passive device extending between the lead fingers;
   providing a leadframe paddle;
   forming at least a groove, a notch, or a relief in the leadframe paddle;
   placing a conductive bonding agent in at least the groove, the notch, the relief, or a combination thereof; and
   placing at least the passive device in the groove, the notch, the relief, or a combination thereof, held by the conductive bonding agent between at least one of the lead fingers and the leadframe paddle, the integrated circuit die and the groove, the notch, the relief, or a combination thereof.

7. The method as claimed in claim 6 wherein:
   providing the leadframe provides the lead fingers having tips of at least one of the configurations of straight, increased, side extension, flared, offset, extended, or a combination thereof;
   placing the passive device provides for connecting a small, medium, or large passive device between two of the lead fingers; and
   forming the blind or through grooves forms the blind or through grooves proximate the tips of the lead fingers.

8. The method as claimed in claim 6 further comprising:
   forming the lead fingers into external leads around at least a portion of the integrated circuit package; and
   placing an additional passive device on the external lead exterior to the integrated circuit package.

9. The method as claimed in claim 6 wherein forming the blind or through grooves includes forming a pair of blind or trough reservoirs for the conductive bonding agent adjacent to each of the blind or through grooves.

10. The method as claimed in claim 6 further comprising:
    bonding an integrated circuit die by at least one of a wire or ball to the lead finger;
    encapsulating the integrated circuit die and the lead finger; and
    forming at least one of a solder bump or a ball grid array ball on the lead finger outside the integrated circuit package.

* * * * *

UNITED STATES PATENT AND TRADEMARK OFFICE
CERTIFICATE OF CORRECTION

PATENT NO. : 7,005,325 B2
DATED : February 28, 2006
INVENTOR(S) : Chow et al.

It is certified that error appears in the above-identified patent and that said Letters Patent is hereby corrected as shown below:

Column 8,
Line 58, delete "through-grooves" and insert -- through grooves --.

Column 14,
Line 22, delete "trough" and insert -- through --.

Signed and Sealed this

Eighteenth Day of April, 2006

JON W. DUDAS
*Director of the United States Patent and Trademark Office*